US007214471B2

(12) United States Patent
Iwanaga et al.

(10) Patent No.: US 7,214,471 B2
(45) Date of Patent: May 8, 2007

(54) PHOTOSENSITIVE RESIN FILM AND CURED FILM MADE THEREFROM

(75) Inventors: Shin-ichiro Iwanaga, Tokyo (JP); Tooru Kimura, Tokyo (JP); Kouji Nishikawa, Tokyo (JP)

(73) Assignee: JSR Corporation, Tokyo (JP)

( * ) Notice: Subject to any disclaimer, the term of this patent is extended or adjusted under 35 U.S.C. 154(b) by 65 days.

(21) Appl. No.: 10/551,447

(22) PCT Filed: Mar. 25, 2004

(86) PCT No.: PCT/JP2004/004155

§ 371 (c)(1), (2), (4) Date: Sep. 29, 2005

(87) PCT Pub. No.: WO2004/090637

PCT Pub. Date: Oct. 21, 2004

(65) Prior Publication Data

US 2006/0210912 A1    Sep. 21, 2006

(30) Foreign Application Priority Data

Apr. 1, 2003  (JP)  ............................. 2003-098392

(51) Int. Cl.
G03F 7/033 (2006.01)
(52) U.S. Cl. ............................. 430/281.1; 430/285.1; 430/288.1; 430/910; 430/920; 430/923; 430/18
(58) Field of Classification Search ............. None
See application file for complete search history.

(56) References Cited

U.S. PATENT DOCUMENTS

| 4,935,320 A | * | 6/1990 | Rohde et al. ............. 430/14 |
| 5,217,847 A | * | 6/1993 | Varnell .................. 430/288.1 |
| 6,312,867 B1 | * | 11/2001 | Kinsho et al. ............ 430/270.1 |
| 6,338,936 B1 | * | 1/2002 | Ichikawa et al. ......... 430/285.1 |

FOREIGN PATENT DOCUMENTS

| JP | 03-188150 A | * | 8/1991 |
| JP | 11-271974 A | * | 10/1999 |
| JP | 2000-39709 A | * | 2/2000 |
| JP | 2000-336121 A | * | 12/2000 |
| JP | 2002-182381 A | * | 6/2002 |
| JP | 2003-29604 A | * | 1/2003 |
| JP | 2003-113174 A | * | 4/2003 |

OTHER PUBLICATIONS 2003-29604, Jan. 31, 2003, JP (English abstract only), no document.
2002-182381 Jun. 26, 2002, JP (English abstract only), no document.
2000-39709, Feb. 8, 2000, JP (English abstract only), no document.
2003-336121, Dec. 5, 2000, JP (English abstract only & Equivalent of US 6312867), no document.
11-271974, Oct. 8, 1999, JP (English abstract only), no document.
3-188150, Aug. 16, 1991, JP (English abstract only & Equivalent of US 5217847), no document.
2003-113174, Apr. 18, 2003, JP (English abstract only), no document.

* cited by examiner

Primary Examiner—Cynthia Hamilton
(74) Attorney, Agent, or Firm—Oblon, Spivak, McClelland, Maier & Neustadt, P.C.

(57) ABSTRACT

The photosensitive resin film in an uncured state of the invention comprises (A) a specific alkali-soluble copolymer, (B) a compound having at least one ethylenically unsaturated double bond and (C) a radiation-sensitive radical polymerization initiator by the use of which a coating film having a dry film thickness of 70 μm in an uncured state has a 365 nm radiation transmittance of not less than 10% and a 405 nm radiation transmittance of not less than 60%, contains the radiation-sensitive radical polymerization initiator (C) in an amount of 20 to 40 parts by weight based on 100 parts by weight of the component (A), and has a dry film thickness of not less than 50 μm. According to the photosensitive resin film, a high bump having a height of not less than 50 μm can be readily formed on a chip substrate with high precision though formation of such a high bump is difficult by the conventional technique. Moreover, connection failure of an element can be inhibited, and reliability of an element can be enhanced.

9 Claims, No Drawings

PHOTOSENSITIVE RESIN FILM AND CURED FILM MADE THEREFROM

TECHNICAL FIELD

The present invention relates to a photosensitive resin film and a cured film thereof. More particularly, the invention relates to a photosensitive resin film favorably used for forming bumps by photo-application and a cured film thereof.

BACKGROUND ART

Photo-application is a general term of technology to manufacture various precision parts by a process comprising applying a radiation-sensitive resin composition to a surface of a workpiece, then patterning the coating film by photolithography and performing electroforming techniques, such as chemical etching, electrolytic etching and electroplating, singly or in combination, using the patterned film as a mask. This photo-application is the main stream of precision fine work technology at present.

In recent years, with downsizing of electronic instruments such as cellular phones, high integration and multilayer metallization of LSI have been rapidly advanced, and application of a multipin mounting method to boards (printed wiring boards, referred to as "board(s)" simply hereinafter) that are used for mounting LSI on electronic instruments has been desired. For example, bear chip mounting by TAB system or flip chip system has been paid attention. In such a multipin mounting method, a protruded electrode called a bump that is a connecting terminal needs to be arranged on a LSI chip with high precision, and it is thought that formation of a bump with much higher precision will be further required in the future to cope with further downsizing of LSI chips.

There are bumps of various shapes, such as ball bump, mushroom bump and straight bump, and in the conventional bumps, the height is mainly not less than 15 μm, more specifically about 20 to 30 μm.

With respect to a material to form a bump of such a height, the present inventors have already proposed a radiation-sensitive resin composition that is preferable as a bump-forming or wiring-forming material improved in adhesion to a substrate in the development stage of photolithography, wettability with a plating solution and plating solution resistance (Japanese Patent Laid-Open Publication No. 39709/2000). If this radiation-sensitive resin composition is used in the photo-application, a bump-forming material that exhibits excellent developability with an alkali developing solution, sufficient resolution in a film thickness of not less than 20 μm, adhesion to a substrate in the development stage, wettability with a plating solution and plating solution resistance can be obtained, and hence, formation of a bump having a height of about 20 to 30 μm with high precision becomes feasible.

By the way, when a LSI chip and a board are connected by a bump as described above, a stress is brought about by a difference in a coefficient of thermal linear expansion between the LSI chip and the board, and they are sometimes disconnected. To inhibit such connection failure and to enhance reliability of an element, it is desirable to increase the amount of gold or solder of the bump that is a connecting part to thereby relax the stress. In this case, if a distance (also referred to as a "pitch" hereinafter) between bumps is relatively wide as in the conventional LSI chips, an area of the gold or solder portion can be increased to assure the amount of gold or solder. However, if the pitch is narrowed because of higher precision of bumps, the area of the gold or solder portion cannot be increased, and therefore, the height of the bump needs to be increased to assure the amount of gold or solder.

However, if an attempt to form a bump of a greater height (also referred to as a "high bump" hereinafter) on a LSI chip (also referred to as a "chip" simply hereinafter) with high precision by means of photo-application is made using a material comprising a radiation-sensitive resin composition that is used in the usual bump formation, the following problem is brought about.

That is to say, it is difficult to form, on a chip substrate, a coating film having a film thickness necessary for forming a high bump, and even if a coating film of such a film thickness can be formed, the film has a low transmittance. Therefore, when the film is irradiated with a radiation, the surface of the film is cured but the portion near the chip substrate is not sufficiently cured, and consequently, a desired pattern cannot be obtained with high precision.

DISCLOSURE OF THE INVENTION

Under such circumstances as described above, the present inventors have earnestly studied, and as a result, they have found that a photosensitive resin film in an uncured state, which comprises (A) a specific alkali-soluble copolymer, (B) a compound having at least one ethylenically unsaturated double bond and (C) a radiation-sensitive radical polymerization initiator by the use of which a coating film having a dry film thickness of 70 μm in an uncured state has a 365 nm radiation transmittance of not less than 10% and a 405 nm radiation transmittance of not less than 60%, contains the radiation-sensitive radical polymerization initiator (C) in an amount of 20 to 40 parts by weight based on 100 parts by weight of the component (A) and has a dry film thickness of not less than 50 μm, is favorable for forming high bumps. Based on the finding, the present invention has been accomplished.

That is to say, it is an object of the present invention to provide a photosensitive resin film that is favorable for bump formation by photo-application and a cured film thereof. More particularly, it is an object of the invention to provide a photosensitive resin film that is favorable for forming bumps having a height of not less than 50 μm and a cured film thereof.

Specifically, the photosensitive resin film in an uncured state according to the present invention is a photosensitive resin film comprising:

(A) an alkali-soluble copolymer comprising (a) constituent units derived from α-methyl-p-hydroxystyrene, in amounts of 1 to 30% by weight, (b) constituent units derived from a radical polymerizable compound having a carboxyl group, in amounts of 5 to 20% by weight, (c) constituent units derived from an acrylic acid aliphatic ester, in amounts of 20 to 40% by weight, and (d) constituent units derived from a radical polymerizable compound having a polycyclic aliphatic group, in amounts of 30 to 60% by weight, (B) a compound having at least one ethylenically unsaturated double bond, and (C) a radiation-sensitive radical polymerization initiator by the use of which a coating film having a dry film thickness of 70 μm in an uncured state has a 365 nm radiation transmittance of not less than 10% and a 405 nm radiation transmittance of not less than 60%, wherein the radiation-sensitive radical polymerization initiator (C) is contained in an amount of 20 to 40 parts by weight based on 100 parts by weight of the component (A), and a dry film thickness of said photosensitive resin film is not less than 50 µm.

In the photosensitive resin film, the compound (B) having at least one ethylenically unsaturated double bond is preferably contained in an amount of 30 to 80 parts by weight based on 100 parts by weight of the alkali-soluble copolymer (A).

In the photosensitive resin film, the alkali-soluble copolymer (A) preferably has a glass transition temperature of not lower than 60° C.

In the photosensitive resin film, the constituent units (d) derived from a radical polymerizable compound having a polycyclic aliphatic group, which constitute the alkali-soluble copolymer (A), are preferably those derived from isobornyl(meth)acrylate and tricyclo[5.2.1.0$^{2,6}$]decanyl (meth)acrylate.

In the photosensitive resin film, the radiation-sensitive radical polymerization initiator (C) preferably comprises (e) 2,2-dimethoxy-1,2-diphenylethane-1-one and (f) 2,4,6-trimethylbenzoyldiphenylphosphine oxide, and the 2,2-dimethoxy-1,2-diphenylethane-1-one (e) is preferably contained in an amount of 17 to 30 parts by weight and the 2,4,6-trimethylbenzoyldiphenylphosphine oxide (f) is preferably contained in an amount of 3 to 10 parts by weight, based on 100 parts by weight of the alkali-soluble copolymer (A).

The cured film according to the present invention is a cured film obtained by photo-curing a photosensitive resin film in an uncured state, said photosensitive resin film comprising:

(A) an alkali-soluble copolymer comprising (a) constituent units derived from α-methyl-p-hydroxystyrene, in amounts of 1 to 30% by weight, (b) constituent units derived from a radical polymerizable compound having a carboxyl group, in amounts of 5 to 20% by weight, (c) constituent units derived from an acrylic acid aliphatic ester, in amounts of 20 to 40% by weight, and (d) constituent units derived from a radical polymerizable compound having a polycyclic aliphatic group, in amounts of 30 to 60% by weight, (B) a compound having at least one ethylenically unsaturated double bond, and (C) a radiation-sensitive radical polymerization initiator by the use of which a coating film having a dry film thickness of 70 µm in an uncured state has a 365 nm radiation transmittance of not less than 10% and a 405 nm radiation transmittance of not less than 60%, in said photosensitive resin film, the radiation-sensitive radical polymerization initiator (C) being contained in an amount of 20 to 40 parts by weight based on 100 parts by weight of the component (A), and a dry film thickness of said photosensitive resin film being not less than 50 µm.

BEST MODE FOR CARRYING OUT THE INVENTION

The present invention is described in more detail hereinafter.

The photosensitive resin film in an uncured state according to the invention comprises (A) a specific alkali-soluble copolymer, (B) a compound having at least one ethylenically unsaturated double bond and (C) a radiation-sensitive radical polymerization initiator by the use of which a coating film having a dry film thickness of 70 µm in an uncured state has a 365 nm radiation transmittance of not less than 10% and a 405 nm radiation transmittance of not less than 60%, contains the radiation-sensitive radical polymerization initiator (C) in an amount of 20 to 40 parts by weight based on 100 parts by weight of the component (A), and has a dry film thickness of not less than 50 µm.

In other words, it is desirable that the photosensitive resin film in an uncured state according to the invention has a dry film thickness of not less than 50 nm, comprises (A) a specific alkali-soluble copolymer, (B) a compound having at least one ethylenically unsaturated double bond and (C) a radiation-sensitive radical polymerization initiator, and that the radiation-sensitive radical polymerization initiator (C) is a radiation-sensitive radical polymerization initiator of such a type and such an amount that when a coating film having a dry film thickness of 70 µm in an uncured state containing at least the copolymer (A), the compound (B) and the radiation-sensitive radical polymerization initiator (C) is formed, the coating film has a 365 nm radiation transmittance of not less than 10% and a 405 nm radiation transmittance of not less than 60%, and this radiation-sensitive radical polymerization initiator (C) is contained in an amount of 20 to 40 parts by weight based on 100 parts by weight of the component (A).

First, each component is described.

(A) Alkali-Soluble Copolymer

The alkali-soluble copolymer used in the photosensitive resin film of the invention is a copolymer having alkali-solubility, and comprises:

(a) constituent units derived from α-methyl-p-hydroxystyrene, (b) constituent units derived from a radical polymerizable compound having a carboxyl group, (c) constituent units derived from an acrylic acid aliphatic ester and (d) constituent units derived from a radical polymerizable compound having a polycyclic aliphatic group.

The alkali-soluble copolymer can be obtained by subjecting compounds capable of deriving the constituent units (a) to (d) to radical copolymerization in an appropriate solvent so that the constituent units (a) to (d) should be contained in the later-described given amounts.

(a) Constituent Unit Derived from α-methyl-p-hydroxystyrene

The constituent units (a) are derived from α-methyl-p-hydroxystyrene and mainly control a molecular weight of the alkali-soluble copolymer.

The amount of the constituent units (a) derived from α-methyl-p-hydroxystyrene in the alkali-soluble copolymer (A) is in the range of usually 1 to 30% by weight, preferably 5 to 20% by weight. When the amount of the constituent units (a) in the alkali-soluble copolymer (A) is in the above range, the molecular weight of the resulting copolymer (A) can be sufficiently increased, formation of a film having a film thickness of not less than 50 µm becomes feasible, and resolution of the resulting photosensitive resin film becomes excellent.

(b) Constituent Unit Derived from Radical Polymerizable Compound Having Carboxyl Group The constituent units (b) are derived from a radical polymerizable compound having a carboxyl group (except a compound having a polycyclic aliphatic group described in (d) later) (referred to as a "carboxyl group compound" hereinafter) and mainly control alkali-solubility of the alkali-soluble copolymer (A).

Examples of the carboxyl group compounds employable include monocarboxylic acids, such as acrylic acid, methacrylic acid and crotonic acid; dicarboxylic acids, such as maleic acid, fumaric acid, citraconic acid, mesaconic acid and itaconic acid; (meth)acrylic acid derivatives having a carboxyl group, such as 2-succinoylethyl(meth)acrylate, 2-maleoylethyl(meth)acrylate, 2-hexahydrophthaloylethyl (meth)acrylate, ω-carboxypolycaprolactone monoacrylate (commercial product: e.g., Aronix M-5300 available from Toagosei Co., Ltd.), phthalic monohydroxyethyl acrylate (commercial product: e.g., Aronix M-5400 available from the same company) and acrylic acid dimer (commercial product: e.g., Aronix M-5600 available from the same company). These compounds can be used singly or in combination of two or more kinds. Of these, acrylic acid, methacrylic acid and 2-hexahydrophthaloylethyl methacrylate are preferable.

The amount of the constituent units (b) derived from a radical polymerizable compound having a carboxyl group in the alkali-soluble copolymer (A) is in the range of usually 5 to 20% by weight, preferably 10 to 15% by weight. When the amount of the constituent units (b) in the alkali-soluble copolymer (A) is in the above range, the resulting photosensitive resin film exhibits excellent solubility in an alkali developing solution, and satisfactory resolution can be attained without occurrence of film remaining after the development.

(c) Constituent Unit Derived from Acrylic Acid Aliphatic Ester

The constituent units (c) are derived from an acrylic acid aliphatic ester and mainly control polymerizability of the alkali-soluble copolymer (A) to thereby control a molecular weight and a polymerization ratio. In this specification, the "acrylic acid aliphatic ester" means a compound other than the compound having a polycyclic aliphatic group described in (d) later, and means a substituted or unsubstituted aliphatic acrylate (except a compound corresponding to the carboxyl group compound described in (b) above).

Examples of such acrylic acid aliphatic esters include unsubstituted alkyl acrylates, such as methyl acrylate, ethyl acrylate, n-butyl acrylate, sec-butyl acrylate, tert-butyl acrylate, isopropyl acrylate, n-hexyl acrylate, isobutyl acrylate, lauryl acrylate and cetyl acrylate; arylalkyl acrylates, such as benzyl acrylate; alkoxyalkyl acrylates, such as 2-methoxyethyl acrylate and 3-butoxybutyl acrylate; aryloxyalkyl acrylates, such as phenoxyethyl acrylate; hydroxyalkyl acrylates, such as 2-hydroxyethyl acrylate and 2-hydroxypropyl acrylate; and alkyl acrylates having other substituents, such as ethylcarbitol acrylate, tetrahydrofurfuryl acrylate, phenoxypolyethylene glycol acrylate, 2-acryloyloxyethyl-2-hydroxypropyl acrylate, dimethylaminoethyl acrylate and morpholinoethyl acrylate. Of these, unsubstituted alkyl acrylates are preferable. These compounds can be used singly or in combination of two or more kinds.

The amount of the constituent units (c) derived from an acrylic acid aliphatic ester in the alkali-soluble copolymer (A) is in the range of usually 20 to 40% by weight, preferably 25 to 35% by weight. When the amount of the constituent units (c) in the alkali-soluble copolymer (A) is in the above range, the molecular weight and the polymerization reaction ratio of the alkali-soluble copolymer (A) can be properly controlled, and physical strength of the resulting photosensitive resin film can be controlled.

(d) Constituent Unit Derived from Radical Polymerizable Compound Having Polycyclic Aliphatic Group The constituent units (d) are derived from a radical polymerizable compound having a polycyclic aliphatic group and mainly control a glass transition temperature of the alkali-soluble copolymer (A).

Examples of the radical polymerizable compounds employable include tricyclo[5.2.1.0$^{2,6}$]decanyloxyethyl (meth)acrylate, isobornyl(meth)acrylate and tricyclo [5.2.1.0$^{2,6}$]decanyl(meth)acrylate. These compounds can be used singly or in combination of two or more kinds.

Of these, isobornyl(meth)acrylate and tricyclo[5.2.1.0$^{2,6}$] decanyl(meth)acrylate are preferable, and a combined use of isobornyl(meth)acrylate and tricyclo[5.2.1.0$^{2,6}$]decanyl (meth)acrylate is more preferable. By the combined use of isobornyl (meth)acrylate and tricyclo[5.2.1.0$^{2,6}$]decanyl (meth)acrylate, hydrophobic property of the resulting photosensitive resin film can be improved to thereby impart plating solution resistance to the film.

The amount of the constituent units (d) derived from a radical polymerizable compound having a polycyclic aliphatic group in the alkali-soluble copolymer (A) is in the range of usually 30 to 60% by weight, preferably 35 to 55% by weight. When the amount of the constituent units (d) in the alkali-soluble copolymer (A) is in the above range, the glass transition temperature of the alkali-soluble copolymer (A) can be adjusted to not lower than 60° C. When the glass transition temperature of the alkali-soluble copolymer (A) is not lower than 60° C., preferably 60 to 100° C., plating solution resistance of a cured film after pattern formation is improved when plating is performed on a chip under heating through the cured film, and moreover, there is an advantage that tackiness of the photosensitive resin film in an uncured state can be reduced.

Polymerization Solvent, Polymerization Catalyst, Etc.

Examples of the polymerization solvents used for preparing the alkali-soluble copolymer (A) include alcohols, such as methanol, ethanol, ethylene glycol, diethylene glycol and propylene glycol; cyclic ethers, such as tetrahydrofuran and dioxane; alkyl ethers of polyhydric alcohols, such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether and propylene glycol monoethyl ether; alkyl ether acetates of polyhydric alcohols, such as ethylene glycol ethyl ether acetate, diethylene glycol ethyl ether acetate, propylene glycol ethyl ether acetate and propylene glycol monomethyl ether acetate; aromatic hydrocarbons, such as toluene and xylene; ketones, such as acetone, methyl ethyl ketone, methyl isobutyl ketone, cyclohexanone, 4-hydroxy-4-methyl-2-pentanone and diacetone alcohol; and esters, such as ethyl acetate, butyl acetate, ethyl 2-hydroxypropionate, ethyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, ethyl acetate, butyl acetate and ethyl lactate.

Of these, preferable are cyclic ethers, alkyl ethers of polyhydric alcohols, alkyl ether acetates of polyhydric alcohols, ketones and esters.

As the polymerization catalyst for the radical copolymerization, a usual radical polymerization initiator is employable. Examples thereof include azo compounds, such as 2,2'-azobisisobutyronitrile, 2,2'-azobis-(2,4-dimethylvaleronitrile) and 2,2'-azobis-(4-methoxy-2-dimethylvaleronitrile); organic peroxides, such as benzoyl peroxide, lauroyl peroxide, tert-butyl peroxypivalate and 1,1'-bis(tert-butylperoxy)cyclohexane; and hydrogen peroxide. When the organic peroxide is used as the radical polymerization initiator, the radical polymerization initiator may be a redox type initiator using a combination of the organic peroxide and a reducing agent.

The alkali-soluble copolymer (A) obtained by the radical copolymerization has a weight-average molecular weight (Mw) in terms of polystyrene, as measured by gel permeation chromatography, of usually 1,000 to 100,000, preferably 2,000 to 50,000, more preferably 3,000 to 20,000.

As previously described, the glass transition temperature of the alkali-soluble copolymer (A) is not lower than 60° C., preferably 60 to 100° C., from the viewpoints of improvement of plating solution resistance of the resulting cured film and inhibition of tackiness of the photosensitive resin film in an uncured state.

(B) Compound Having at Least One Ethylenically Unsaturated Double Bond

The compound (B) having at least one ethylenically unsaturated double bond (referred to as an "ethylenically unsaturated compound (B)" hereinafter) for use in the invention is a compound which has at least one ethylincally unsaturated group in a molecule and is a liquid or a solid at ordinary temperature. In general, a (meth)acrylate compound having a (meth)acryloyl group as the ethylenically unsaturated group or a compound having a vinyl group as the ethylenically unsaturated group is preferably employed.

The (meth)acrylate compounds are grouped into monofunctional compounds and polyfunctional compounds, and any of those compounds is employable.

Examples of the ethylenically unsaturated compounds (B) include:

monofunctional compounds, such as 2-hydroxyethyl (meth)acrylate, 2-hydroxypropyl(meth)acrylate, 2-hydroxybutyl(meth)acrylate, methyl(meth)acrylate, ethyl (meth) acrylate, propyl(meth)acrylate, isopropyl (meth)acrylate, butyl(meth)acrylate, isobutyl (meth)acrylate, tert-butyl (meth)acrylate, pentyl (meth)acrylate, isoamyl(meth)acrylate, hexyl (meth)acrylate, heptyl(meth)acrylate, octyl (meth)acrylate, isooctyl(meth)acrylate, 2-ethylhexyl (meth) acrylate, nonyl(meth)acrylate, decyl (meth)acrylate, isodecyl(meth)acrylate, undecyl (meth)acrylate, dodecylamyl (meth)acrylate, lauryl (meth)acrylate, octadecyl(meth) acrylate, stearyl (meth)acrylate, tetrahydrofurfuryl(meth) acrylate, butoxyethyl(meth)acrylate, ethoxydiethylene glycol (meth)acrylate, benzyl(meth)acrylate, cyclohexyl (meth)acrylate, phenoxyethyl(meth)acrylate, polyethylene glycol mono(meth)acrylate, polypropylene glycol mono (meth)acrylate, methoxyethylene glycol(meth)acrylate, ethoxyethyl(meth)acrylate, methoxypolyethylene glycol (meth)acrylate, phenoxypolyethylene glycol(meth)acrylate, phenoxypolypropylene glycol(meth)acrylate, methoxypolypropylene glycol(meth)acrylate, tricyclo[$5.2.1.0^{2,6}$] decadienyl(meth)acrylate, tricyclo[$5.2.1.0^{2,6}$]decanyl(meth) acrylate, tricyclo[$5.2.1.0^{2,6}$]decenyl(meth)acrylate, isobornyl (meth)acrylate, bornyl(meth)acrylate, diacetone (meth)acrylamide, isobutoxymethyl(meth)acrylamide, N-vinylpyrrolidone, N-vinylcaprolactam, N,N-dimethyl (meth) acrylamide, tert-octyl(meth)acrylamide, dimethylaminoethyl(meth)acrylate, diethylaminoethyl (meth)acrylate, 7-amino-3,7-dimethyloctyl(meth)acrylate, dimethyl maleate, diethyl maleate, dimethyl fumarate, diethyl fumarate, ethylene glycol monomethyl ether (meth)acrylate, ethylene glycol monoethyl ether (meth)acrylate, glycerol(meth)acrylate, acrylamide, methacrylamide and (meth)acrylonitrile; and polyfunctional compounds, such as trimethylolpropane tri(meth)acrylate, ethylene glycol di(meth)acrylate, tetraethylene glycol di(meth)acrylate, polyethylene glycol di(meth) acrylate, 1,4-butanediol di(meth)acrylate, butylene glycol di(meth)acrylate, propylene glycol di(meth)acrylate, trimethylolpropane di(meth)acrylate, 1,6-hexanediol di(meth) acrylate, neopentyl glycol di(meth)acrylate, tris(2-hydroxyethyl)isocyanurate tri(meth)acrylate, tris(2-hydroxyethyl) isocyanurate di(meth)acrylate, tricyclodecanedimethanol di(meth)acrylate, epoxy(meth)acrylate obtained by addition of (meth)acrylic acid to diglycidyl ether of bisphenol A, bisphenol A di(meth)acryloyloxyethyl ether, bisphenol A di(meth)acryloyloxyethyloxyethyl ether, bisphenol A di(meth)acryloyloxyloxymethylethyl ether, tetramethylolpropane tetra(meth)acrylate, pentaerythritol tri(meth)acrylate, pentaerythritol tetra(meth)acrylate, dipentaerythritol penta(meth)acrylate and dipentaerythritol hexa(meth)acrylate.

As the ethylenically unsaturated compound (B), a commercial compound can be used as it is. Examples of the commercial compounds include Aronix M-210, Aronix M-309, Aronix M-310, Aronix M-400, Aronix M-7100, Aronix M-8030, Aronix M-8060, Aronix M-8100, Aronix M-9050, Aronix M-240, Aronix M-245, Aronix M-6100, Aronix M-6200, Aronix M-6250, Aronix M-6300, Aronix M-6400 and Aronix M-6500 (all available from Toagosei Co., Ltd.), KAYARAD R-551, KAYARAD R-712, KAYARAD TMPTA, KAYARAD HDDA, KAYARAD TPGDA, KAYARAD PEG400DA, KAYARAD MANDA, KAYARAD HX-220, KAYARAD HX-620, KAYARAD R-604, KAYARAD DPCA-20, KAYARAD DPCA-30, KAYARAD DPCA-60 and KAYARAD DPCA-120 (all available from Nippon Kayaku Co., Ltd.), and Biscoat #295, Biscoat #300, Biscoat #260, Biscoat #312, Biscoat #335HP, Biscoat #360, Biscoat #GPT, Biscoat #3PA and Biscoat #400 (all available from Osaka Organic Chemical Industry, Ltd.).

The above ethylenically unsaturated compounds (B) may be used singly or in combination of two or more kinds. The ethylenically unsaturated compound (B) is used in an amount of usually 30 to 80 parts by weight, preferably 40 to 65 parts by weight, based on 100 parts by weight of the copolymer (A) having alkali-solubility. When the amount of the ethylenically unsaturated compound (B) is in the above range, the resulting photosensitive resin film exhibits excellent sensitivity when exposed, and the compound (B) has good compatibility with the copolymer (A) to enhance storage stability of the coating solution. Moreover, because of excellent curability in the exposure, a film having a thickness of not less than 50 μm can be preferably formed.

(C) Radiation-Sensitive Radical Polymerization Initiator

The radiation-sensitive radical polymerization initiator (C) for use in the invention is a radiation-sensitive radical polymerization initiator by the use of which a coating film having a dry film thickness of 70 μm in an uncured state has a 365 nm radiation transmittance of not less than 10%, preferably 12 to 30%, and a 405 nm radiation transmittance of not less than 60%, preferably 65 to 80%.

The term "radiation" used herein means ultraviolet radiation, visible light, far ultraviolet radiation, X rays, electron beam or the like, and a mercury lamp is usually used as a light source for curing photosensitive resins. For curing photosensitive resins, i rays having a wavelength of 365 nm and h rays having a wavelength of 405 nm are generally used.

Of the above rays, the i rays have high energy and high curing power and hardly suffers curing inhibition by oxygen, but they are liable to be absorbed because of its short wavelength. Therefore, when the i rays are used for curing a photosensitive resin film of a large film thickness, sufficient energy cannot reach the bottom of the photosensitive resin film, and a pattern of desired shape cannot be obtained occasionally. More specifically, the shape of a section of the photosensitive resin film after patterning does not become rectangular but becomes a trapezoid wherein the bottom of the photosensitive resin film is narrower than the surface thereof, and a pattern of desired shape cannot be obtained occasionally.

On the other hand, the h rays have lower energy than the i rays, so that curing takes a longer time, and curing of the surface of the photosensitive resin film is sometimes inhibited by oxygen to markedly lower a residual film ratio after patterning. However, the light transmittance is high because the h rays have a longer wavelength than the i rays, and even when they are used for curing a photosensitive resin film of a large film thickness, energy readily reaches even the bottom of the photosensitive resin film, so that the shape of a section of the photosensitive resin film after patterning becomes rectangular and a pattern of desired shape can be readily obtained.

In the present invention, taking into consideration such properties of the i rays and the h rays as mentioned above, there is employed a radiation-sensitive radical polymerization initiator (C) of such a type in such an amount that when a coating film having a dry film thickness of 70 μm in an uncured state is formed, the coating film has a 365 nm radiation transmittance of not less than a specific value and a 405 nm radiation transmittance of not less than a specific value. As a result, when a photosensitive resin film having a film thickness of not less than 50 μm is formed on a chip substrate, not only a surface of the photosensitive resin film but also a bottom thereof can be sufficiently cured by irradiation with i rays and h rays, whereby a desired pattern can be obtained with high precision.

That is to say, by enhancing transmittances at both of the above wavelengths, attenuation of a light that is transmitted to the inside from the surface of the photosensitive resin film is suppressed to thereby uniformly cure the whole of the photosensitive resin film, whereby a cured film having such a section of a patterned portion that the base and the side meet at substantially right angles can be obtained. Therefore, formation of a straight high bump with high precision becomes feasible.

Measurement of the transmittance can be carried out by, for example, the following method.

First, an ethyl lactate solution (65% by weight) of a composition containing the alkali-soluble copolymer (A), the compound (B) having at least one ethylenically unsaturated double bond and the radiation-sensitive radical polymerization initiator (C) in given amounts is prepared. Then, a film of the composition is formed on a quartz substrate having a thickness of 1 mm by spin coating, and thereafter, the film is baked on a hot plate at 120° C. for 5 minutes to remove the solvent and thereby form a coating film. In this case, the rotation number in the spin coating is controlled in advance so that the coating film after baking should have a thickness of 70 μm.

The coating film formed on the quartz substrate as above is measured on a transmittance at a wavelength of 300 nm to 500 nm by means of a spectrophotometer (HITACHI Spectrophotometer U-2010), while a quartz substrate having no coating film is used as a reference.

Further, an absorption coefficient ε can be also determined by applying the transmittance measured above to the formula $\epsilon = \log(I_0/I)/L$ ($\epsilon$: absorption coefficient ($m^{-1}$), I: light intensity (cd) immediately after transmission by the coating film, $I_0$: light intensity (cd) before transmission by the coating film, L: dry film thickness (m) of the coating film).

According to the above formula, the radiation-sensitive radical polymerization initiator for use in the invention is desired to be one having such a type and such an amount that when a coating film having a dry film thickness of 70 μm in an uncured state is formed, the coating film has a 365 nm radiation absorption coefficient of usually not more than 15000 $m^{-1}$ and a 405 nm radiation absorption coefficient of usually not more than 4000 $m^{-1}$.

Examples of the radiation-sensitive radical polymerization initiators include acylphosphine oxides, such as 2,4,6-trimethylbenzoyldiphenylphosphine oxide and bis-(2,6-dimethoxybenzoyl)-2,4,4-trimethylpentylphosphine oxide; 2,2-dimethoxy-1,2-diphenylethane-1-one, benzyl dimethyl ketal, benzyl-β-methoxyethyl acetal, and 1-phenyl-1,2-propanedione-2-(o-ethoxycarbonyl)oxime. Examples of commercial products thereof include Lucirin TPO (available from BASF Japan Ltd.) and Irgacure 651 (available from Ciba Specialty Chemicals K.K.). These compounds can be used singly or in combination of two or more kinds.

Of the above compounds, a combined use of 2,2-dimethoxy-1,2-diphenylethane-1-one and 2,4,6-trimethylbenzoyldiphenylphosphine oxide is preferable.

The radiation-sensitive radical polymerization initiator is used in an amount of usually 20 to 40 parts by weight, preferably 20 to 30 parts by weight, more preferably 22 to 27 parts by weight, based on 100 parts by weight of the alkali-soluble copolymer (A).

By the use of the radiation-sensitive radical polymerization initiator in an amount of the above range, transmittances at the wavelengths of both of i rays and h rays can be enhanced, and not only the surface of the photosensitive resin film but also the bottom thereof can be sufficiently cured. Further, because influences of deactivation of radicals due to oxygen on the photosensitive resin film (lowering of sensitivity) are inhibited, a desired pattern can be obtained with high precision. Furthermore, compatibility in the coating solution and storage stability of the coating solution can be improved.

In the combined use of (e) 2,2-dimethoxy-1,2-diphenylethane-1-one and (f) 2,4,6-trimethylbenzoyldiphenylphosphine oxide, the 2,2-dimethoxy-1,2-diphenylethane-1-one (e) is desirably used in an amount of usually 17 to 30 parts by weight, preferably 17 to 22 parts by weight, and the 2,4,6-trimethylbenzoyldiphenylphosphine oxide (f) is desirably used in an amount of usually 3 to 10 parts by weight, preferably 3 to 8 parts by weight, based on 100 parts by weight of the alkali-soluble copolymer (A).

Other Components

In the present invention, other components, such as solvent and various additives, can be used when needed, in addition to the alkali-soluble copolymer (A), the ethylenically unsaturated compound (B) and the radiation-sensitive radical polymerization initiator (C).

The organic solvent for use is a solvent that is capable of homogeneously dissolving the alkali-soluble copolymer (A) and other components and is unreactive to each component. As such organic solvents, solvents similar to the polymerization solvents used for the preparation of the alkali-soluble copolymer (A) are employable. Further, high-boiling solvents, such as N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonylacetone, isophorone, caproic-acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate and phenyl cellosolve acetate, can be also added.

Of the above solvents, alkyl ethers of polyhydric alcohols, such as ethylene glycol monoethyl ether and diethylene glycol monomethyl ether; alkyl ether acetates of polyhydric alcohols, such as ethyl cellosolve acetate and propylene glycol monomethyl ether acetate; esters, such as ethyl 3-ethoxypropionate, methyl 3-methoxypropionate, ethyl 2-hydroxypropionate and ethyl lactate; and ketones, such as diacetone alcohol, are preferable from the viewpoints of dissolving power, reactivity to each component and ease of film formation. The amount of the solvent can be properly determined according to the purpose, coating method, etc.

To the photosensitive resin film of the invention, a thermal polymerization inhibitor can be added. Examples of the thermal polymerization inhibitors include pyrogallol, benzoquinone, hydroquinone, methylene blue, tert-butyl catechol, monobenzyl ether, methylhydroquinone, amylquinone, amyloxyhydroquinone, n-butylphenol, phenol, hydroquinone monopropyl ether, 4,4'-(1-methylethylidene)bis(2-methylphenol), 4,4'-(1-methylethylidene)bis(2,6-dimethylphenol), 4,4'-[1-[4-(1-(4-hydroxyphenyl)-1-methylethyl)phenyl]ethylidene]bisphenol, 4,4',4"-ethylidenetris(2-methylphenol), 4,4',4"-ethylidenetrisphenol and 1,1,3-tris(2,5-dimethyl-4-hydroxyphenyl)-3-phenylpropane. The thermal polymerization inhibitor is used in an amount of preferably not more than 5 parts by weight based on 100 parts by weight of the alkali-soluble copolymer (A).

To the photosensitive resin film of the invention, further, a surface active agent can be added for the purpose of enhancing coating properties, anti-forming properties and leveling properties. As the surface active agents, there can be employed fluorine surface active agents which are on the market under the trade names of, for example, BM-1000 and BM-1100 (all available from BM Chemy Co.), Megafac F142D, Megafac F172, Megafac F173 and Megafac F183 (all available from Dainippon Ink & Chemicals, Inc.), Fluorad FC-135, Fluorad FC-170C, Fluorad FC-430 and Fluorad FC-431 (all available from Sumitomo 3M Limited), Surflon S-112, Surflon S-113, Surflon S-131, Surflon S-141 and Surflon S-145 (all available from Asahi Glass Co., Ltd.), and SH-28PA, SH-190, SH-193, SZ-6032 and SF-8428-(all available from Dow Corning Toray Silicone Co., Ltd.). The surface active agent is used in an amount of preferably not more than 5 parts by weight based on 100 parts by weight of the alkali-soluble copolymer (A).

In order to improve adhesion to a chip substrate, an adhesion assistant can be employed in the photosensitive resin film. As the adhesion assistant, a functional silane coupling agent is effective. The functional silane coupling agent means a silane coupling agent having a reactive substituent, such as a carboxyl group, a methacryloyl group, an isocyanate group or an epoxy group. Examples of such functional silane coupling agents include trimethoxysilylbenzoic acid, γ-methacryloxypropyltrimethoxysilane, vinyltriacetoxysilane, vinyltrimethoxysilane, γ-isocyanatopropyltriethoxysilane, γ-glycidoxypropyltrimethoxysilane and β-(3,4-epoxycyclohexyl)ethyltrimethoxysilane. The functional silane coupling agent is used in an amount of preferably not more than 20 parts by weight based on 100 parts by weight of the alkali-soluble copolymer (A).

For performing fine control of solubility in an alkali developing solution in the formation of the photosensitive resin film of the invention, to the coating solution can be added monocarboxylic acids, such as acetic acid, propionic acid, n-butyric acid, isobutyric acid, n-valeric acid, isovaleric acid, benzoic acid and cinnamic acid; hydroxymonocarboxylic acids, such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid and syringin acid; polycarboxylic acids, such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, trimellitic acid, pyromellitic acid, cyclopentanetetracarboxylic acid, butanetetracarboxylic acid and 1,2,5,8-naphthalenetetracarboxylic acid; and acid anhydrides, such as itaconic anhydride, succinic anhydride, citraconic anhydride, dodecenylsuccinic anhydride, tricarballylic anhydride, maleic anhydride, hexahydrophthalic anhydride, methyltetrahydrophthalic anhydride, hymic anhydride, 1,2,3,4-butanetetracarboxylic dianhydride, cyclopentanetetracarboxylic dianhydride, phthalic anhydride, pyromellitic anhydride, trimellitic anhydride, benzophenonetetracarboxylic anhydride, ethylene glycol bistrimellitate anhydride and glycerol tris(trimellitate) anhydride.

Moreover, to the photosensitive resin film of the invention can be added fillers, colorants, viscosity modifiers, etc., when needed.

Examples of the fillers include silica, alumina, talc, bentonite, zirconium, silicate and powder glass.

Examples of the colorants include body extender pigments, such as alumina white, clay, barium carbonate and barium sulfate; inorganic pigments, such as zinc white, white lead, yellow lead, red lead, ultramarine, Prussian Blue, titanium oxide, zinc chromate, red iron oxide and carbon black; organic pigments, such as Brilliant Carmine 6B, Permanent Red 6B, Permanent Red R, Benzidine Yellow, Phthalocyanine Blue and Phthalocyanine Green; basic dyes, such as magenta and rhodamine; direct dyes, such as Direct Scarlet and Direct Orange; and acid dyes, such as Roselyn and Metanil Yellow.

Examples of the viscosity modifiers include bentonite, silica gel and aluminum powder. These additives are used within limits not detrimental to the objects of the invention, and they are preferably used in amounts of not more than 50% by weight based on 100% by weight of the total of the components (A), (B) and (C).

Photosensitive Resin Film and Cured Film Thereof

Using the aforesaid components, the photosensitive resin film of the invention is formed. In order to form the film, the components are mixed to prepare a radiation-sensitive resin composition first.

In the preparation of the resin composition, if a filler and a pigment are not added, the components (A), (B) and (C) and if necessary other components have only to be mixed and stirred by a usual method, and if a filler and a pigment are added, these components have only to be dispersed and mixed by means of a dispersing machine, such as a dissolver, a homogenizer or a three-roll mill. When necessary, each component or the resulting resin composition may be filtered by means of a mesh or a membrane filter.

Using the resin composition obtained as above, the photosensitive resin film of the invention is formed. The photosensitive resin composition may be applied onto a chip substrate and heated to remove the solvent, whereby a desired photosensitive resin film is formed on the chip substrate, or the photosensitive resin composition may be applied in advance onto a flexible base film and dried to form a photosensitive resin film, and the thus formed photosensitive resin film may be bonded onto a chip substrate when it is used.

In the above case, the photosensitive resin film formed on the base film is preferably stored by laminating a cover film thereon when it is not used.

Examples of the base films employable herein include films of synthetic resins, such as polyethylene terephthalate, polyethylene, polypropylene, polycarbonate, polyether sulfone and polyvinyl chloride. The thickness of the base film is preferably in the range of 15 to 125 μm.

For forming the photosensitive resin film, an applicator, a bar coater, a roll coater, a curtain flow coater, a die coater, a spin coater, screen printing, etc. are employed. The thickness of the resulting photosensitive resin film is usually not less than 50 μm, preferably 50 to 150 μm, more preferably 50 to 100 μm, on the dry basis after removal of solvent. When the dry film thickness of the resulting photosensitive resin film is not less than 50 μm, a high bump can be favorably formed by photo-application.

In the formation of the photosensitive resin film, the drying conditions vary depending upon the type of each component in the resin composition, compounding ratio, thickness of the coating film, etc., but the drying temperature is in the range of usually 60 to 160° C., preferably 80 to 150° C., and the drying time is in the range of about 5 to 20 minutes. If the drying time is too short, adhesion in the development becomes bad. If the drying time is too long, lowering of resolution due to thermal fogging is sometimes induced.

In the case where a high bump is formed by using the photosensitive resin film of the invention and by subjecting a chip substrate to electroplating, the surface of the chip substrate needs to have been coated with a metal. The method for coating the surface of the chip substrate with a metal is not specifically restricted, and metal deposition, sputtering or the like is employable.

The photosensitive resin film formed on the chip substrate as above is irradiated with an ultraviolet radiation or a visible light having a wavelength of 300 to 500 nm through a photomask in shape of a prescribed pattern to photo-cure the exposed portion other than a bump pattern, and the unexposed portion is removed by alkali development, whereby a cured film of the invention can be obtained.

As the light source, a low pressure mercury lamp, a high pressure mercury lamp, an extra-high pressure mercury lamp, a metal halide lamp, an argon gas laser or the like is employable. The light irradiation dose varies depending upon the type of each component in the composition, amount thereof, thickness of the coating film, etc., but in case of using, for example, a high pressure mercury lamp, the irradiation dose is in the range of 100 to 1500 mJ/cm$^2$.

For the development, an alkaline aqueous solution is used as a developing solution, and the unnecessary unexposed portion is dissolved and removed, whereby only the exposed portion is allowed to remain to obtain a cured film of a desired pattern.

Examples of the developing solutions employable herein include aqueous solutions of alkalis such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene and 1,5-diazabicyclo[4.3.0]-5-nonane.

Also employable as the developing solutions are aqueous solutions obtained by adding a water-soluble organic solvent such as methanol or ethanol or a surface active agent in a proper amount to the above aqueous solutions of alkalis.

Although the developing time varies depending upon the type of each component in the composition, compounding ratio, thickness of the coating film, etc., it is in the range of usually 30 to 360 seconds. The developing method may be any of puddling, dipping, paddling, spraying and shower development. After the development, washing with running water is performed for 30 to 90 seconds, and then, air drying using an air gun or drying by heating using a hot plate or an oven is performed.

The photosensitive resin film of the invention can be sufficiently cured even by the above-described light irradiation only, but depending upon the purpose, the film may be further cured by additional light irradiation (referred to as "post exposure" hereinafter) or heating. The post exposure can be carried out in the same manner as in the abovementioned radiation irradiation. The irradiation dose is not specifically restricted, but in case of using, for example, a high pressure mercury lamp, the irradiation dose is preferably in the range of 100 to 2000 mJ/cm$^2$. In case of heating, the resin film has only to be heated using a heating device such as a hot plate or an oven at a given temperature, for example, 60 to 100° C., for a given period of time, for example, 5 to 30 minutes on a hot plate or 5 to 60 minutes in an oven. By performing this post treatment, a cured film of a desired pattern having more excellent properties can be obtained.

The chip substrate having the patterned cured film is immersed in various plating solutions for electroplating, then the electric current and the electroplating time are set so that a desired plated metal thickness should be obtained, and plating is performed. Then, the chip substrate is immersed in a peeling solution at 50 to 80° C. for 5 to 30 minutes with stirring the solution, to peel the cured film, whereby a straight high bump having a section wherein the base and the side meet at substantially right angles can be formed.

The peeling solution used herein is, for example, an aqueous solution of a quaternary ammonium salt or a mixed solution of a quaternary ammonium salt, dimethyl sulfoxide and water.

EFFECT OF THE INVENTION

According to the photosensitive resin film of the invention and the cured film thereof, a high bump having a height of not less than 50 μm can be readily formed on a chip substrate with high precision though formation of such a high bump is difficult by the conventional technique. By virtue of such a high bump, connection failure of an element can be inhibited, and reliability of an element can be enhanced.

EXAMPLES

The present invention is further described with reference to the following examples, but it should be construed that the invention is in no way limited to those examples.

Synthesis Example 1

Synthesis of Alkali-Soluble Copolymer A1

A flask equipped with a dry ice/methanol reflux device was purged with nitrogen, then 3.0 g of 2,2'-azobisisobutyronitrile as a polymerization initiator and 100 g of ethyl lactate as a solvent were placed in the flask, and they were stirred until the polymerization initiator was dissolved. Subsequently, 15 g of α-methyl-p-hydroxystyene, 10 g of methacrylic acid, 30 g of n-butyl acrylate, 20 g of isobornyl acrylate and 25 g of tricyclo[$5.2.1.0^{2,6}$]decanyl methacrylate were placed, and stirring was slowly started. Then, the temperature of the solution was raised to 80° C., and polymerization was performed at this temperature for 6 hours.

Thereafter, the reaction product was dropwise added to a large amount of methanol to solidify the reaction product. The resulting solid was washed with water, then dissolved again in the same weight of tetrahydrofuran as that of the solid and dropwise added to a large amount of methanol to solidify the product again. After the operations of dissolution and solidification were carried out three times, the resulting solid was vacuum dried at 40° C. for 48 hours to obtain a desired copolymer A1.

Synthesis Examples 2–17

Synthesis of Alkali-Soluble Copolymers A2 to A11 and CA1 to CA6

Copolymers A2 to A11 and CA1 to CA6 were synthesized in the same manner as in the synthesis of the copolymer A1 in Synthesis Example 1, except that the types and the amounts of the compounds were changed in accordance with compositions shown in the following Table 1.

Example 1

Preparation of Resin Composition

To 100 g of the copolymer A1 obtained in Synthesis Example 1, 18 g of 2,2-dimethoxy-1,2-diphenylethane-1-one and 6 g of 2,4,6-trimethylbenzoyldiphenylphosphine oxide as radiation-sensitive radical polymerization initiators, 50 g of Aronix M8060 as an ethylenically unsaturated compound, 0.3 g of NBX-15 (available from Neos Technologies Inc.) as a surface active agent and 90 g of ethyl lactate as a solvent were added, and they were stirred to give a homogeneous solution.

The resulting composition solution was filtered through a capsule filter having a pore diameter of 10 μm to obtain a radiation-sensitive liquid resin composition.

Preparation of Photosensitive Resin Film

Onto a substrate obtained by forming a TiW thin film of 1000 Å on a silicone wafer by sputtering and then forming a Cu thin film of 1000 Å thereon by sputtering, the radiation-sensitive liquid resin composition was applied using a spin coater, and then the composition was prebaked on a hot plate at 120° C. for 5 minutes to form a photosensitive resin film having a film thickness of 70 μm.

Property Evaluation of Photosensitive Resin Film and Cured Film (1) Evaluation of Transmittance A photosensitive resin film having a film thickness of 70 μm was formed on a quartz substrate having a thickness of 1 mm in the same manner as described above. Then, measurements of transmittances at 365 nm and 405 nm were

TABLE 1

| Copolymer | Glass transition temperature (° C.) | Component a (g) | | Component b (g) | | Component c (g) | | Component d (g) | | | Others (g) |
|---|---|---|---|---|---|---|---|---|---|---|---|
| | | a1 | a2 | b1 | b2 | c1 | c2 | d1 | d2 | d3 | e1 |
| A1 | 61.5 | 15 | | 10 | | | 30 | 20 | | 25 | |
| A2 | 81 | 15 | | 10 | | 30 | | 20 | | 25 | |
| A3 | 70 | 15 | | 10 | | | 30 | | 20 | 25 | |
| A4 | 60.1 | 15 | | 15 | | | 30 | 25 | | 15 | |
| A5 | 64.2 | 20 | | 10 | | | 25 | 40 | | 5 | |
| A6 | 75.1 | 5 | | 15 | | | 25 | 20 | | 35 | |
| A7 | 60.8 | 15 | | 10 | | | 25 | 45 | | 5 | |
| A8 | 71.5 | 5 | | 10 | | | 30 | | | 55 | |
| A9 | 94.6 | 20 | | 10 | | 30 | | | | 40 | |
| A10 | 87.4 | 5 | | 15 | | | 25 | | | 55 | |
| A11 | 77.4 | 20 | | 15 | | 5 | 20 | | 40 | | |
| CA1 | 28 | 35 | | 15 | | | 50 | | | | |
| CA2 | 27.4 | 40 | | 10 | | | 50 | | | | |
| CA3 | 125.2 | 20 | | 20 | | | 15 | | | 45 | |
| CA4 | 26.4 | 30 | | 10 | | | 50 | 10 | | | |
| CA5 | 85.1 | | 20 | 20 | | | 20 | | 40 | | |
| CA6 | 121.4 | 10 | | 10 | 15 | | | | | 45 | 20 | a1: α-methyl-p-hydroxystyrene
a2: α-methyl-m-hydroxystyrene
b1: methacrylic acid
b2: 2-hexahydrophthaloylethyl methacrylate
c1: ethyl acrylate
c2: n-butyl acrylate
d1: isobornyl acrylate
d2: tricyclo[$5.2.1.0^{2,6}$]decanyl acrylate
d3: tricyclo[$5.2.1.0^{2,6}$]decanyl methacrylate
e1: n-butyl methyacrylate carried out using a HITACHI Spectrophotometer U-2010, while a quartz substrate used in the application was used as a reference.

(2) Evaluation of Resolution

The photosensitive resin film obtained above was exposed to an ultraviolet radiation of 1000 mJ/cm² through a pattern mask for resolution measurement by means of an extra-high pressure mercury lamp (OSRAM HBO-1000 W/D). Then, the resin film was developed with a 2.38 wt % aqueous solution of tetramethylammonium hydroxide, washed with running water and spin-dried to obtain a patterned cured film as a test specimen.

The test specimen was observed by a scanning electron microscope to measure a resolution. The "resolution" was judged by resolving a square pattern of 75 μm×75 μm. A case where the pattern was resolved without any residual resist and an angle of the side was 85 to 95° was evaluated as "A", and a case where the resulting image deviated from the above range was evaluated as "B".

(3) Evaluation of Adhesion Properties

Adhesion to the substrate was evaluated by observing a section of the resist-cured film after development by means of a scanning electron microscope. A film in which lifting of resist was not observed at the periphery of the opening or the edge of the wafer was evaluated as "A", and a film in which lifting of resist or peeling of resist was observed was evaluated as "B".

(4) Evaluation of Residual Film Ratio

The residual film ratio was determined by measuring a film thickness after development. The residual film ratio is a value obtained by dividing a film thickness after development by a film thickness after prebaking and multiplying the obtained value by 100. A film having a residual film ratio of not less than 90% was evaluated as "A", and a film having a residual film ratio of less than 90% was evaluated as "B".

(5) Evaluation of Plating Resistance and Peeling Properties

The substrate having a patterned cured film obtained above was used as a test specimen. The specimen was subjected to copper electroplating and then immersed in a peeling solution (THB-S2, available from JSR Co., Ltd.) at 40° C. for 20 minutes with stirring the solution. For the electroplating, MICROFAB CU200 (available from Electroplating Engineers of Japan Ltd.) was used as a plating solution, and electroplating was carried out under the conditions of 25° C., 3A/dm² and 40 minutes, to obtain a bump having a height of 60 μm.

Plating resistance was evaluated according to a criterion that the resist pattern was transferred to the plated metal to give the same shape after peeling as that of the resist pattern, that is, the bump width was within 103% of the resist pattern and deposition of a plating solution due to exudation from the resist opening did not take place. A case where these requirements were satisfied was evaluated as "A", and a case where these requirements were not satisfied was evaluated as "B".

Further, the test specimen from which the cured film had been peeled according to the above method was observed by a scanning electron microscope to evaluate peeling properties. A case where no film residue was observed was evaluated as "A", and a case where a residue was observed was evaluated as "B".

The evaluation results are all set forth in Table 3.

Examples 2–16

Radiation-sensitive liquid resin compositions were prepared in the same manner as in Example 1, except that the compositional ratios were changed as shown in Table 2. Then, properties of the photosensitive resin films and the cured films were evaluated in the same manner as in Example 1.

The results are set forth in Table 3.

Comparative Examples 1–12

Radiation-sensitive liquid resin compositions were prepared in the same manner as in Example 1, except that the compositional ratios were changed as shown in Table 2. Then, properties of the photosensitive resin films and the cured films were evaluated in the same manner as in Example 1.

The results are set forth in Table 3.

TABLE 2

| | Copolymer | | Ethylenically unsaturated compound (g) | | | | | Radical polymerization initiator (g) | | | | |
|---|---|---|---|---|---|---|---|---|---|---|---|---|
| | | (g) | B1 | B2 | B3 | B4 | B5 | C1 | C2 | C3 | C4 | C5 |
| Ex. 1 | A1 | 100 | 50 | | | | | 6 | 18 | | | |
| Ex. 2 | A2 | 100 | 50 | | | | | 6 | 18 | | | |
| Ex. 3 | A3 | 100 | 50 | | | | | 6 | 18 | | | |
| Ex. 4 | A4 | 100 | 50 | | | | | 6 | 18 | | | |
| Ex. 5 | A5 | 100 | 50 | | | | | 6 | 18 | | | |
| Ex. 6 | A6 | 100 | 50 | | | | | 6 | 18 | | | |
| Ex. 7 | A7 | 100 | 50 | | | | | 6 | 18 | | | |
| Ex. 8 | A8 | 100 | 50 | | | | | 6 | 18 | | | |
| Ex. 9 | A9 | 100 | 50 | | | | | 6 | 18 | | | |
| Ex. 10 | A10 | 100 | 50 | | | | | 6 | 18 | | | |
| Ex. 11 | A11 | 100 | 50 | | | | | 6 | 18 | | | |
| Ex. 12 | A2 | 100 | 30 | | | | | 6 | 18 | | | |
| Ex. 13 | A2 | 100 | 70 | | | | | 6 | 18 | | | |
| Ex. 14 | A2 | 100 | | 30 | | | 20 | 6 | 18 | | | |
| Ex. 15 | A2 | 100 | | | 30 | | 20 | 6 | 18 | | | |
| Ex. 16 | A2 | 100 | | | 20 | 10 | 20 | 6 | 18 | | | |
| Comp. Ex. 1 | CA1 | 100 | 50 | | | | | 6 | 18 | | | |
| Comp. Ex. 2 | CA2 | 100 | 50 | | | | | 6 | 18 | | | |
| Comp. Ex. 3 | CA3 | 100 | 50 | | | | | 6 | 18 | | | |
| Comp. Ex. 4 | CA4 | 100 | 50 | | | | | 6 | 18 | | | |

TABLE 2-continued

|  | Copolymer | (g) | Ethylenically unsaturated compound (g) | | | | | Radical polymerization initiator (g) | | | | |
| --- | --- | --- | --- | --- | --- | --- | --- | --- | --- | --- | --- | --- |
|  |  |  | B1 | B2 | B3 | B4 | B5 | C1 | C2 | C3 | C4 | C5 |
| Comp. Ex. 5 | CA5 | 100 | 50 |  |  |  |  | 6 | 18 |  |  |  |
| Comp. Ex. 6 | CA6 | 100 | 50 |  |  |  |  | 6 | 18 |  |  |  |
| Comp. Ex. 7 | A2 | 100 | 20 |  |  |  |  | 6 | 18 |  |  |  |
| Comp. Ex. 8 | A2 | 100 | 90 |  |  |  |  | 6 | 18 |  |  |  |
| Comp. Ex. 9 | A2 | 100 | 50 |  |  |  |  |  |  | 3.34 | 3.34 | 2.01 |
| Comp. Ex. 10 | A2 | 100 | 50 |  |  |  |  | 44 | 24 |  |  |  |
| Comp. Ex. 11 | A2 | 100 |  | 30 |  |  | 20 |  |  | 3.34 | 3.34 | 2.01 |
| Comp. Ex. 12 | A2 | 100 |  | 30 |  |  | 20 | 44 | 24 |  |  |  |

B1: Aronix M8060 (available from Toagosei Co., Ltd.)
B2: pentaerythritol triacrylate
B3: trimethylolpropane triacrylate
B4: dimethyloltricyclodecane diacrylate
B5: dipentaerythritol pentaacrylate
C1: 2,4,6-trimethylbenzoyldiphenylphosphine oxide
C2: 2,2-dimethoxy-1,2-diphenylethene-1-one
C3: (1,2'-bisimidazole)-1,2'-dicyclophenyl-3,3',4,4'-tetraphenyl
C4: 4,4'-bis(diethylamino)benzophenone
C5: mercaptobenzothiazole

TABLE 3

|  | Transmittance (%) | | Resolution (shape of pattern) | Adhesion properties | Residual film ratio | Plating solution resistance | Peeling properties |
| --- | --- | --- | --- | --- | --- | --- | --- |
|  | 365 nm | 405 nm |  |  |  |  |  |
| Ex. 1 | 16.6 | 70 | A | A | A | A | A |
| Ex. 2 | 16.6 | 70 | A | A | A | A | A |
| Ex. 3 | 16.6 | 70 | A | A | A | A | A |
| Ex. 4 | 16.6 | 70 | A | A | A | A | A |
| Ex. 5 | 16.6 | 70 | A | A | A | A | A |
| Ex. 6 | 16.6 | 70 | A | A | A | A | A |
| Ex. 7 | 16.6 | 70 | A | A | A | A | A |
| Ex. 8 | 16.6 | 70 | A | A | A | A | A |
| Ex. 9 | 16.6 | 70 | A | A | A | A | A |
| Ex. 10 | 16.6 | 70 | A | A | A | A | A |
| Ex. 11 | 16.6 | 70 | A | A | A | A | A |
| Ex. 12 | 16.6 | 70 | A | A | A | A | A |
| Ex. 13 | 16.6 | 70 | A | A | A | A | A |
| Ex. 14 | 16.6 | 70 | A | A | A | A | A |
| Ex. 15 | 16.6 | 70 | A | A | A | A | A |
| Ex. 16 | 16.6 | 70 | A | A | A | A | A |
| Comp. Ex. 1 | 16.6 | 70 | A | A | B | B | A |
| Comp. Ex. 2 | 16.6 | 70 | B | A | B | B | — |
| Comp. Ex. 3 | 16.6 | 70 | B | B | B | B | — |
| Comp. Ex. 4 | 16.6 | 70 | B | A | B | B | — |
| Comp. Ex. 5 | 16.6 | 70 | B | B | B | B | — |
| Comp. Ex. 6 | 16.6 | 70 | B | B | B | B | — |
| Comp. Ex. 7 | 16.6 | 70 | B | A | B | B | A |
| Comp. Ex. 8 | 16.6 | 70 | A | A | A | A | B |
| Comp. Ex. 9 | <1 | <1 | B | B | A | A | A |
| Comp. Ex. 10 | <1 | 20.1 | B | B | A | A | A |
| Comp. Ex. 11 | <1 | <1 | B | B | A | A | B |
| Comp. Ex. 12 | <1 | 20.1 | B | B | A | A | B |

INDUSTRIAL APPLICABILITY

The photosensitive resin film and the cured film of the invention are favorable for bump formation by photo-application and are useful for the semiconductor industry.

The invention claimed is:

1. A photosensitive resin film in an uncured state, comprising:
(A) an alkali-soluble copolymer comprising:
(a) constituent units derived from α-methyl-p-hydroxystyrene, in amounts of 1 to 30% by weight,
(b) constituent units derived from a radical polymerizable compound having a carboxyl group, in amounts of 5 to 20% by weight,
(c) constituent units derived from an acrylic acid aliphatic ester, in amounts of 20 to 40% by weight, and
(d) constituent units derived from a radical polymerizable compound having a polycyclic aliphatic group, in amounts of 30 to 60% by weight,
(B) a compound having at least one ethylenically unsaturated double bond, and
(C) a radiation-sensitive radical polymerization initiator by the use of which a coating film having a dry film thickness of 70 μm in an uncured state has a 365 nm radiation transmittance of not less than 10% and a 405 nm radiation transmittance of not less than 60%, wherein the radiation-sensitive radical polymerization initiator (C) is contained in an amount of 20 to 40 parts by weight based on 100 parts by weight of the component (A), and a dry film thickness of said photosensitive resin film is not less than 50 μm.

2. The photosensitive resin film as claimed in claim 1, wherein the compound (B) having at least one ethylenically unsaturated double bond is contained in an amount of 30 to 80 parts by weight based on 100 parts by weight of the alkali-soluble copolymer (A).

3. The photosensitive resin film as claimed in claim 1, wherein the alkali-soluble copolymer (A) has a glass transition temperature of not lower than 60° C.

4. The photosensitive resin film as claimed in claim 1, wherein the constituent units (d) derived from a radical polymerizable compound having a polycyclic aliphatic group, which constitute the alkali-soluble copolymer (A), are derived from isobornyl(meth)acrylate and tricyclo [$5.2.1.0^{2,6}$]decanyl(meth)acrylate.

5. The photosensitive resin film as claimed in claim 1, wherein the radiation-sensitive radical polymerization initiator (C) comprises (e) 2,2-dimethoxy-1,2-diphenylethane-1-one and (f) 2,4,6-trimethylbenzoyldiphenylphosphine oxide, and the 2,2-dimethoxy-1,2-diphenylethane-1-one (e) is contained in an amount of 17 to 30 parts by weight and the 2,4,6-trimethylbenzoyldiphenylphosphine oxide (f) is contained in an amount of 3 to 10 parts by weight, based on 100 parts by weight of the alkali-soluble copolymer (A).

6. A cured film formed by photo-curing a photosensitive resin film in an uncured state, said photosensitive resin film comprising:

(A) an alkali-soluble copolymer comprising:
   (a) constituent units derived from α-methyl-p-hydroxystyrene, in amounts of 1 to 30% by weight,
   (b) constituent units derived from a radical polymerizable compound having a carboxyl group, in amounts of 5 to 20% by weight,
   (c) constituent units derived from an acrylic acid aliphatic ester, in amounts of 20 to 40% by weight, and
   (d) constituent units derived from a radical polymerizable compound having a polycyclic aliphatic group, in amounts of 30 to 60% by weight,
(B) a compound having at least one ethylenically unsaturated double bond, and (C) a radiation-sensitive radical polymerization initiator by the use of which a coating film having a dry film thickness of 70 μm in an uncured state has a 365 nm radiation transmittance of not less than 10% and a 405 nm radiation transmittance of not less than 60%, in said photosensitive resin film, the radiation-sensitive radical polymerization initiator (C) being contained in an amount of 20 to 40 parts by weight based on 100 parts by weight of the component (A), and a dry film thickness of said photosensitive resin film being not less than 50 μm.

7. The photosensitive resin film as claimed in claim 2, wherein the radiation-sensitive radical polymerization initiator (C) comprises (e) 2,2-dimethoxy-1,2-diphenylethane-1-one and (f) 2,4,6-trimethylbenzoyldiphenylphosphine oxide, and the 2,2-dimethoxy-1,2-diphenylethane-1-one (e) is contained in an amount of 17 to 30 parts by weight and the 2,4,6-trimethylbenzoyldiphenylphosphine oxide (f) is contained in an amount of 3 to 10 parts by weight, based on 100 parts by weight of the alkali-soluble copolymer (A).

8. The photosensitive resin film as claimed in claim 3, wherein the radiation-sensitive radical polymerization initiator (C) comprises (e) 2,2-dimethoxy-1,2-diphenylethane-1-one and (f) 2,4,6-trimethylbenzoyldiphenylphosphine oxide, and the 2,2-dimethoxy-1,2-diphenylethane-1-one (e) is contained in an amount of 17 to 30 parts by weight and the 2,4,6-trimethylbenzoyldiphenylphosphine oxide (f) is contained in an amount of 3 to 10 parts by weight, based on 100 parts by weight of the alkali-soluble copolymer (A).

9. The photosensitive resin film as claimed in claim 4, wherein the radiation-sensitive radical polymerization initiator (C) comprises (e) 2,2-dimethoxy-1,2-diphenylethane-1-one and (f) 2,4,6-trimethylbenzoyldiphenylphosphine oxide, and the 2,2-dimethoxy-1,2-diphenylethane-1-one (e) is contained in an amount of 17 to 30 parts by weight and the 2,4,6-trimethylbenzoyldiphenylphosphine oxide (f) is contained in an amount of 3 to 10 parts by weight, based on 100 parts by weight of the alkali-soluble copolymer (A).

* * * * *